US006432830B1

(12) United States Patent
Merry

(10) Patent No.: US 6,432,830 B1
(45) Date of Patent: *Aug. 13, 2002

(54) SEMICONDUCTOR FABRICATION PROCESS

(75) Inventor: Walter Richardson Merry, Cupertino, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/079,845

(22) Filed: May 15, 1998

(51) Int. Cl.$^7$ .................... H01L 21/302; H01L 21/3065
(52) U.S. Cl. .................... 438/706; 438/712; 438/719; 438/723; 438/743
(58) Field of Search ................. 438/706, 719, 438/723, 743, 712

(56) References Cited

U.S. PATENT DOCUMENTS

| | | | |
|---|---|---|---|
| 4,590,091 A | 5/1986 | Rogers, Jr. et al. | 427/53.1 |
| 4,673,456 A | 6/1987 | Spencer et al. | 156/345 |
| 4,836,902 A | 6/1989 | Kalnitsky et al. | 204/192.32 |
| 5,022,961 A | 6/1991 | Izumi et al. | 156/646 |
| 5,067,437 A * | 11/1991 | Watanabe et al. | 118/715 |
| 5,134,089 A | 7/1992 | Barden et al. | 437/70 |
| 5,286,344 A | 2/1994 | Bialock et al. | 156/657 |
| 5,298,112 A | 3/1994 | Hayasaka et al. | 156/643 |
| 5,306,671 A | 4/1994 | Ogawa et al. | 437/225 |
| 5,350,480 A | 9/1994 | Gray et al. | 156/345 |
| 5,382,316 A | 1/1995 | Hills et al. | 156/643 |
| 5,403,434 A | 4/1995 | Moslehi | 156/643 |
| 5,413,950 A | 5/1995 | Chen et al. | 437/52 |
| 5,413,954 A | 5/1995 | Aydil et al. | 437/81 |
| 5,425,843 A * | 6/1995 | Saul et al. | 438/694 |
| 5,460,999 A | 10/1995 | Hong et al. | 437/60 |
| 5,462,896 A | 10/1995 | Komura et al. | 437/228 |
| 5,500,249 A * | 3/1996 | Telford et al. | 427/255.17 |
| 5,578,163 A | 11/1996 | Yachi | 156/643.1 |
| 5,620,559 A | 4/1997 | Kikuchi | 438/723 |
| 5,693,183 A | 12/1997 | Jeong | 156/653.1 |
| 5,858,878 A * | 1/1999 | Toda | 438/9 |

FOREIGN PATENT DOCUMENTS

| | | | |
|---|---|---|---|
| EP | 0376252 | 12/1989 | |
| JP | 56112722 | * 9/1981 | H01L/21/223 |

OTHER PUBLICATIONS

Takaira, "Manufacture of Semiconductor Device" English Abstract translation of JP56112722, 2 pages, Sep. 1981.*

* cited by examiner

Primary Examiner—Benjamin L. Utech
Assistant Examiner—Lynette T. Umez-Eronini
(74) Attorney, Agent, or Firm—Janah and Associates; Joseph Bach

(57) ABSTRACT

Process for treating a semiconductor substrate 25, polymeric etchant deposits 190, silicon lattice damage 195, and native silicon dioxide layers 185, are removed in sequential process steps. The polymeric etchant deposits 190 are removed using an activated cleaning gas comprising inorganic fluorinated gas and an oxygen gas. Silicon lattice damage 195 are etched using an activated etching gas. Thereafter, an activated reducing gas comprising a hydrogen-containing gas is used to reduce the native silicon dioxide layer 185, on the substrate 25, to a silicon layer. Subsequently, a metal layer 200 is deposited on the substrate 25 and the substrate annealed to form a metal silicide layer 205. Removal of the polymeric etchant deposits 190, the silicon lattice damage 195, and the native silicon oxide layer 185 increases the interfacial conductivity of the metal silicide layer 205 to the underlying silicon-containing substrate 25.

37 Claims, 4 Drawing Sheets

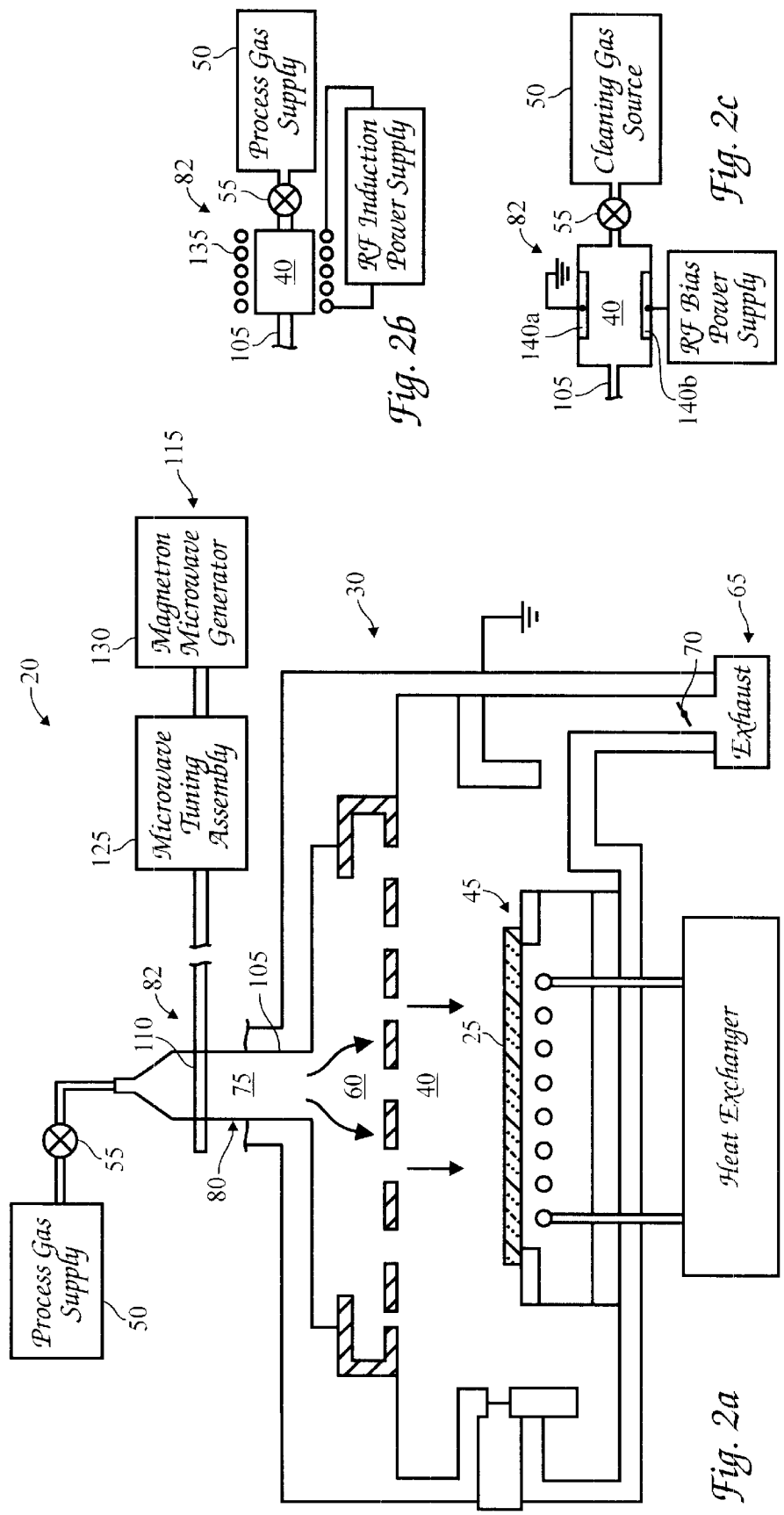

SEMICONDUCTOR FABRICATION PROCESS

BACKGROUND

The present invention relates to a process for forming semiconductor structures using activated process gases.

Integrated circuits have bipolar transistors or Metal Oxide Silicon Field Effect Transistors (MOSFET) that contain conducting, dielectric, and semiconducting layers deposited or thermally grown on a semiconductor substrate by chemical and physical vapor deposition methods. Photolithographic methods are used to form a patterned layers of mask and/or photoresist features covering the layers on the substrate, and the exposed regions of the layers are etched by activated or energized gases, such as for example, $CF_4/O_2$, $CF_4/NF_3$, $NF_3/He$, and $CHF_3/CF_4/Ar$. One problem with these processes arises during removal of residual photoresist from the substrate by ashing or stripping processes. Conventional ashing or stripping processes utilize an oxygen plasma at temperatures greater than 200° C. to ash the residual photoresist. Although these processes are highly selective in stripping photoresist, the high temperatures damage the active devices on the substrate by causing increased diffusion of mobile ions. It is desirable to have a resist removal process that ashes resist without causing diffusion of ions and other materials in the substrate.

Another problem arises from the cleaning or removal of polymeric etchant deposits that are formed on the substrate. The polymeric etchant deposits are byproducts of condensation reactions that are formed between vaporized metal, silicon, and resist species which include carbon, hydrogen, oxygen, and nitrogen. The polymeric etchant deposits are difficult to remove from the substrate because of their chemical composition. Furthermore, because the composition of the polymeric etchant deposits varies depending on the material being etched, the resist composition, and the composition of the etching gas, it is often difficult to clean all of the polymeric etchant deposits without excessive etching of the underlying silicon or other layers.

Yet another problem arises because "native silicon dioxide" films are formed on the exposed silicon containing layers on the substrate, especially during processing of MOSFET structures. For example, oxygen plasmas that are used to ash residual resist on the substrate can cause a native silicon dioxide film to form on exposed silicon portions of the substrate. The native silicon dioxide film typically comprises a layer of silicon dioxide in a thickness of from about 10 to 20 Å, that is formed by oxidation of silicon at elevated temperatures in a process gas containing oxidizing species or oxygen-containing gases. Silicon dioxide films are electrically insulating and are undesirable at interfaces with contact electrodes or interconnecting electrical pathways because they cause high electrical contact resistance. For example, in MOSFET structures, the electrodes and interconnecting pathways comprise self-aligned silicide layers that are formed by depositing a refractory metal layer on bare silicon and annealing the layer to produce a metal silicide layer. Native silicon dioxide films at the interface between the substrate and refractory metal reduce the compositional uniformity of the silicide layers by impeding the diffusional chemical reaction that forms the metal silicide layers. This results in lower substrate yields and increased failure rates due to the overheating at the electrical contacts. The native silicon dioxide film can also prevent adhesion of CVD or sputtered layers which are subsequently deposited on the substrate.

Various methods have been used to etch or clean the native silicon dioxide layers formed on the substrate. However, it is difficult to remove the thin native silicon dioxide layers without damaging the underlying or surrounding layers. For example, U.S. Pat. No. 5,022,961 discloses a process for removing a native silicon dioxide film by etching the substrate with energized gaseous anhydrous hydrogen fluoride and alcohol; and U.S. Pat. No. 4,749,440 describes a similar method using a plasma of hydrogen fluoride and water vapor. The high fluorine content reacts with the native silicon dioxide film to form gaseous $SiF_4$ byproducts, and the alcohol forms a layer covering the silicon surfaces that prevents regrowth of the native silicon dioxide film. However, in both cases an excessive concentration of fluorine ions remain on and contaminate the substrate surface. The energetic plasma etching processes are also undesirable because the energetic impingement of the plasma ions on the substrate often damages the silicon lattice structure of the exposed silicon surfaces on the substrate. The bombardment by the plasma ions creates lattice defects and dislocations that increase junction leakage. In addition, the high etch rates produced by conventional etching methods are difficult to control when etching the thin native silicon dioxide layers on the substrate and can cause excessive etching of surrounding or underlying silicon-containing layers. Also, etchant halogen ions can contaminate the substrate, requiring an additional water cleansing process step to remove the contaminants. This additional process step lowers the throughput of the etching process, and the high surface tension of the water can cause the cleansing step to become ineffective in removing contaminants from trenches or holes having high-aspect ratios.

Accordingly, there is a need for a process for selectively removing residual resist, polymer etchant deposits, and native silicon dioxide films without damaging or etching surrounding or underlying silicon-containing layers. It is also desirable for the process to remove damaged portions of the silicon lattice structure. It is further desirable to remove native silicon dioxide films with high removal rates, good uniformity, and high selectivity ratio relative to the surrounding silicon-containing layers. Finally, it is desirable for the process to provide low levels of contamination of the substrate by contaminant halogen ions.

SUMMARY

The present invention provides a method for removing polymeric etchant deposits, silicon lattice damage, and native silicon dioxide layers on a substrate. In the method, the substrate is placed in a process zone, and exposed to an activated cleaning gas comprising inorganic fluorinated gas and oxygen gas, to remove polymeric etchant deposits o the substrate. Thereafter, the substrate is exposed to an activated etching gas to remove silicon lattice damage on the substrate. The substrate is then exposed to an activated reducing gas to remove a native silicon dioxide layer on the substrate. The cleaning gas, the etching gas, and the reducing gas can be activated remotely or in situ by microwaves or RF energy. Preferably, the activated gases are activated in a remote chamber that is remote from the process zone.

The present invention is particularly useful for a method of forming an active electronic device on a substrate. In the method, a dielectric layer on the substrate comprising one or more of silicon oxide or silicon nitride is etched by exposing the substrate to a dielectric etching gas. Thereafter, polymeric etchant deposits on the substrate are removed by exposing the substrate to activated cleaning gas comprising oxygen gas and inorganic fluorinated gas in a first volumetric flow ratio. The substrate is then exposed to an activated etching gas comprising oxygen gas and inorganic fluorinated gas in a second volumetric flow ratio. An activated reducing gas comprising a hydrogen-containing gas removes native silicon dioxide layers by reacting hydrogen species with oxygen in the native silicon dioxide layer to form volatile water vapor, which is exhausted from the chamber, leaving behind elemental silicon. A metal layer is then deposited on the silicon layer on the substrate thereby exposed, and the substrate is annealed to form a metal silicide layer.

In another aspect, the present invention is directed to a method of removing a native silicon dioxide layer on a substrate by reducing the layer using a reducing gas comprising a hydrogen-containing gas. In the method, the reducing gas is introduced into a remote zone that is remote from the process zone, and a microwave-activated reducing gas is formed by coupling microwaves in the remote zone. Then the microwave-activated reducing gas is introduced into the process zone to reduce the native silicon dioxide layer to a silicon layer. The reducing gas comprising hydrogen-containing gas and inorganic fluorinated gas is capable of forming activated HF species that reduce the native silicon dioxide layer. Preferably, the hydrogen-containing gas comprises one or more of $H_2$, $CH_3F$, $H_2S$, $NH_3$, $CH_4$, $C_2H_6$, $C_3H_8$, and $B_2H_6$. More preferably, the reducing gas comprises inorganic fluorinated gas and hydrogen-containing gas in a volumetric flow ratio of from about 1:5 to about 5:1.

DRAWINGS

These and other features, aspects, and advantages of the present invention will be better understood from the following drawings, description, and appended claims, which illustrate examples of the invention, where:

FIG. 2a is a sectional schematic view of another embodiment of a process chamber having a gas activator for activating the process gas in a remote chamber;

FIG. 2b is a sectional schematic view of another embodiment of the remote chamber of having a gas activator for inductively coupling RF energy in a remote zone;

FIG. 2c is a sectional schematic view of another embodiment of the remote chamber of having a gas activator for capacitively coupling RF energy in the remote zone;

DESCRIPTION

Figure 1:
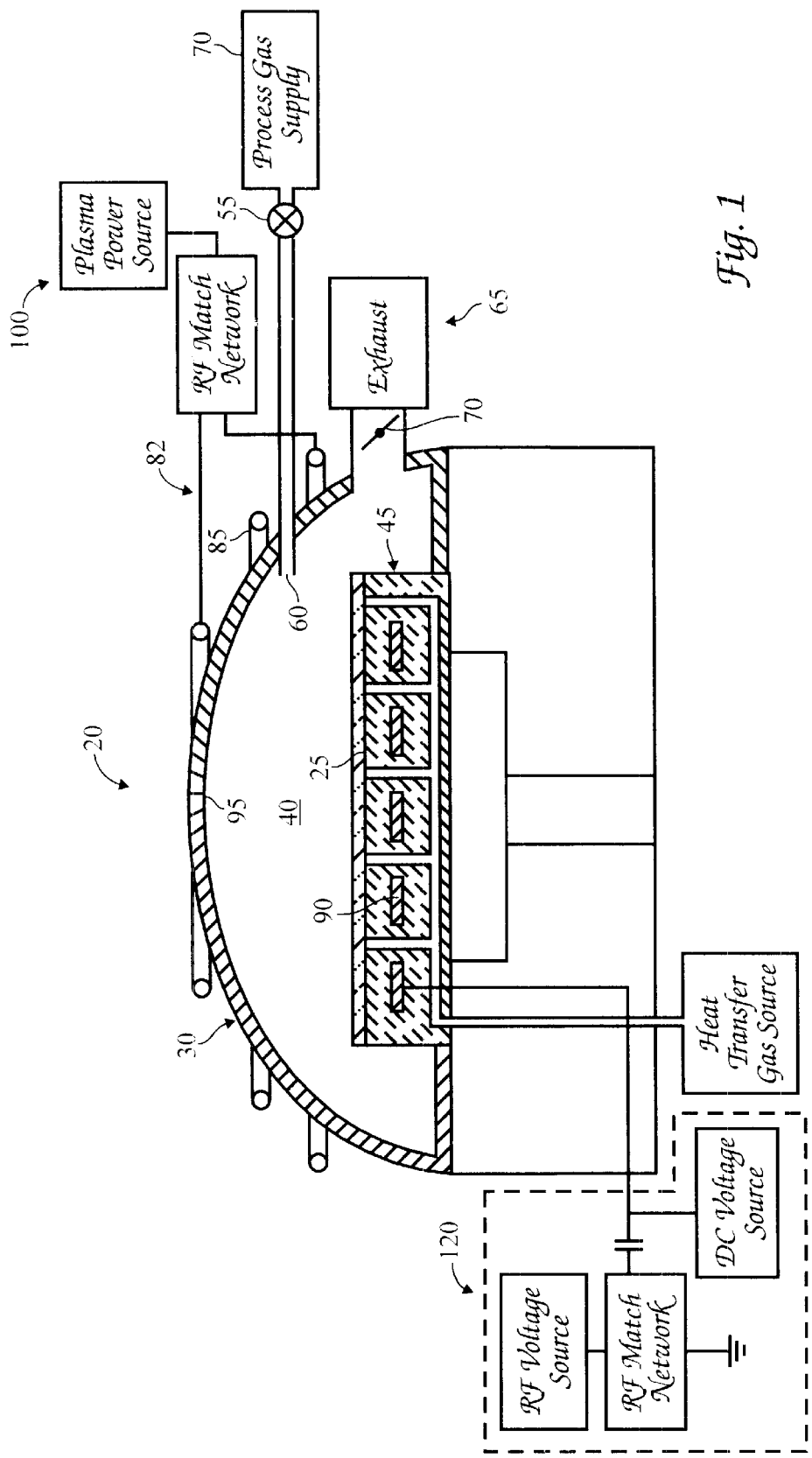
FIG. 1 is a sectional schematic view of a process chamber having a gas activator that activates the process gas in the process zone of the chamber.

FIG. 1 shows an apparatus 20 for stripping residual resist and polymeric etchant deposits, removing damaged portions of a crystalline silicon lattice, and reducing native silicon dioxide layers, on a substrate 25. The apparatus 20 comprises a process chamber 30 having a process zone 40 with a volume of at least about 5,000 cm$^3$, and more preferably from about 10,000 to about 50,000 cm$^3$. A support 45 is provided for holding a substrate 25 in the process zone 40. Typically, the substrate 25 is held in place on the support 45 using a mechanical, vacuum, or electrostatic chuck having grooves in which a heat transfer gas, such as helium, is held to control the temperature of the substrate 25. Process gas is introduced into the chamber 30 through a gas distribution system 48 that includes a process gas supply 50, a gas flow control valve 55, and process gas distributors 60. The process gas distributors 60 can be located peripherally around the substrate 25, as shown in FIG. 1, or can be a showerhead mounted on the ceiling of the chamber 30, as shown in FIG. 2a. Spent process gas and etchant byproducts are exhausted from the process chamber 30 through an exhaust system 65 capable of achieving a minimum pressure of about 10$^{-3}$ mTorr in the process chamber 30. A throttle valve 70 is provided in the exhaust system 65 for controlling the pressure in the chamber 30.

In any of the processes described herein, a gas activator 82 is used to activate the process gas by dissociating, ionizing, or energizing the process gas either in-situ in the process zone 40 of the process chamber 30 (as shown in FIG. 1), or in a remote zone 75 of a remote chamber 80, (as shown in FIGS. 2a to 2c). In the activation process, the process gas is dissociated by application of microwaves to form a variety of gaseous fragments including dissociated atomic species. Alternatively, or in conjunction therewith, the process gas can be ionized by application of capacitively or inductively coupled RF energy to form energized ions, electrons, and neutrals.

For example, in the embodiment shown in FIG. 1, the process gas is activated directly in the process zone 40 by (i) inductive coupling RF energy by applying an RF current to an inductor antenna 85 encircling the process chamber 30, or (ii) capacitive coupling RF energy by applying an RF voltage to process electrodes 90 in the support 45 and the ceiling 95 of the process chamber 30, or (iii) both inductive and capacitive coupling of RF energy. A source power supply 100 supplies an RF potential to the inductor antenna 85. The inductor antenna 85 comprises one or more inductor coils 98 having a circular symmetry with a central axis coincident with the longitudinal vertical axis that extends through the center of the process chamber 30 and perpendicular to the plane of the substrate 25. An electrode voltage supply 120 supplies an RF potential that maintains the process electrodes 65 and the ceiling 95 of the process chamber 30 at different electrical potentials relative to one another. The frequency of the RF voltage applied to the inductor antenna 85 or electrodes 65 is typically about 50 Khz to about 60 MHZ, and more typically about 13.56 MHZ. Typically, the RF voltage applied to the electrodes 65 is at a power level of from about 100 to about 2000 Watts; and/or an RF current at a power level of from about 750 to about 2000 Watts is applied to the inductor antenna 85.

FIGS. 2a to 2c show alternative embodiments of the etching apparatus 20 in which the process gas is activated in the remote chamber 80 that is adjacent and connected to the process zone 40 of the etching chamber 30 via a gas conduit 105. By "remote" it is meant that the center of the remote zone 75 is at a fixed upstream distance from the center of the process zone 40. The gas activator 82 is used to couple microwave or RF energy into the remote chamber 80 to activate the process gas by ionizating or dissociating the process gas. Preferably, the remote zone 75 is located sufficiently distant from the process zone 40 to control of the chemical reactivity of the activated gas formed in the remote zone by allowing at least a portion of the dissociated species to recombine to form undissociated gas molecules. The ratio of the chemically dissociated to non-dissociated or recombined chemical species effects the etching rates because the highly dissociated species provide a more chemically reactive etching process than non-dissociated species. Thus, the remote zone 75 that is spaced apart and remote from the process zone 40 provides greater control of the chemical reactivity of the activated gas. However, a remote zone 75 that is too far distant from the process zone 40 causes excessive recombination of the activated gas species during transport of the species from the remote zone 75 to the substrate 25. Thus preferably, the remote zone 75 comprises a cavity at a distance of at least about 50 mm, and not more than 1000 mm, upstream from the process zone 40, and more preferably at a distance of from about 100 to 600 mm.

In one preferred version, as shown in FIG. 2a, the remote chamber 80 comprises a gas activator 82 that includes a microwave generator 115 that transmits microwaves through a cavity or the chamber. Preferably, the remote chamber 80 comprises a cylindrical tube made of a dielectric material such as quartz, aluminum oxide, or monocrystalline sapphire that is transparent to microwaves and is non-reactive to the process gas. The remote chamber 80 has an outlet connected to the gas distributor 60 disposed in the process zone 40 so that process gas activated by microwaves in the remote zone 75 flows into the process zone 40. The microwave generator 115 can comprise any conventional microwave generator, such as for example, microwave generators commercially available from Daihen Corporation, Japan. Typically, the microwave generator 115 comprises a microwave applicator 110, a microwave tuning assembly 125, and a magnetron 130. The microwave applicator 110 is a shorted waveguide positioned in the remote chamber 80 and in the path of the process gas for coupling a microwave energy to the process gas. The microwave tuning assembly 125 matches the microwave generator 115 impedance to the load impedance, which can vary with process gas flow rates, pressure, and other process variables that change during the etching process. Impedance matching is accomplished by measuring the forward and reflected power in the remote zone 75 and adjusting tuning stubs in the separate tuning assembly 125 disposed between the magnetron 130 and the microwave applicator 110 to minimize reflected power. Preferably, the remote zone 75 is shaped and sized to provide a low Q cavity to allow matching of load impedance over a broad range of impedance values. The microwave generator 115 is typically operated at a power level of about 200 to about 3000 Watts, and at a frequency of about 800 MHZ to about 3000 MHZ.

Referring to FIGS. 2b and 2c, the process gas can also be activated by a gas activator 82 that capacitively or inductively couples RF energy to the process gas in the remote chamber 80. As shown in FIG. 2b, a suitable gas activator 82 comprises an inductor antenna 135 consisting of one or more inductor coils having a circular symmetry with a central axis coincident with the longitudinal vertical axis that extends through the center of the remote chamber 80. Alternatively, as shown in FIG. 2c, the gas activator 82 can also comprise a pair of electrodes 140a,b positioned within the remote chamber 80 to form a capacitively coupled RF energy to the process gas in the remote chamber 80.

The process of the present invention is performed on a substrate 25 of a semiconductor material, for example a silicon or gallium arsenide wafer. Preferably, the substrate 25 is a silicon wafer having a <100>crystallographic orientation and a diameter of 150 mm (6 inches), 200 mm (8 inches), or 300 mm (12 inches). The present process is illustrated with reference to the fabrication of an active electronic device, such as a MOSFET, on a silicon substrate 25, as shown in FIGS. 3a to 3h. Typically, the active electronic device comprises a combination of (i) dielectric layers, such as silicon dioxide, phosphosilicate glass (PSG), borophosphosilicate glass (BPSG), silicon nitride, or combinations thereof; (ii) semiconducting layers such as doped polysilicon, and n-type or p-type doped monocrystalline silicon; and (iii) electrical contacts and interconnect lines formed from layers of metal or metal silicide, such as tungsten, tungsten silicide, or titanium silicide.

Fabrication of the active electronic device begins by forming electrical isolation structures that electrically isolate the active electronic device from other devices. There are several types of electrical isolation structures as generally described in VLSI Technology, Second Edition, Chapter 11, by S. M. Sze, McGraw-Hill Publishing Company (1988), which is incorporated herein by reference. Referring to FIGS. 3a through 3h, in one version, a field oxide layer (not shown) having a thickness of about 2000 Å is first grown over the entire substrate 25, and portions of the oxide layer are removed to form the field oxide barriers 145a,b which surround exposed regions in which the electrically active elements of the device are formed. The exposed regions are thermally oxidized to form a thin gate oxide layer 150 having a thickness of from about 50 to 300 Å. A polysilicon layer is then deposited on the substrate 25, patterned, and etched to create a gate electrode 155. The surface of the polysilicon gate electrode 155 is reoxidized to form an insulating dielectric layer 160, providing the structure shown in FIG. 3a. Next the source and drain 170a,b are formed by doping the appropriate regions with suitable dopant atoms. For example, on p-type substrates 25, an n-type dopant species comprising arsenic or phosphorous is used. Typically the doping is performed by an ion implanter and might comprise, for example, phosphorous ($^{31}$P) at a concentration of about $10^{13}$ atoms/cm$^2$ at an energy level of from about 30 to 80 Kev, or Arsenic ($^{75}$As) at a dose of from about $10^{15}$ to $10^{17}$ atoms/cm and an energy of from 10 to 100 Kev. After the implantation process, the dopant is driven into the substrate 25 by heating the substrate, for example, in a rapid thermal processing, RTP, apparatus. Thereafter, the oxide layer 150 covering the source and drain regions 170a,b is stripped in a conventional stripping process to remove any impurities caused by the implantation process which are trapped in the oxide layer, providing the structure shown in FIG. 3b.

Figure 3A:
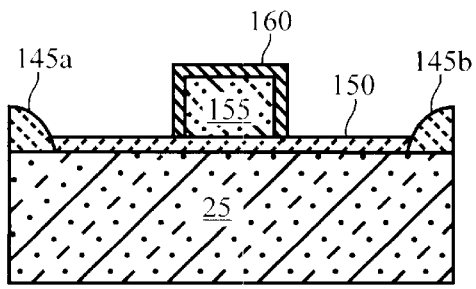
FIG. 3a to 3h are sectional schematic views of successive steps in the fabrication of MOSFET structures on a substrate by the process of the present invention.
Figure 3E:
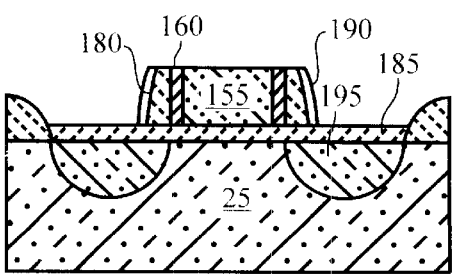
Figure 3B:
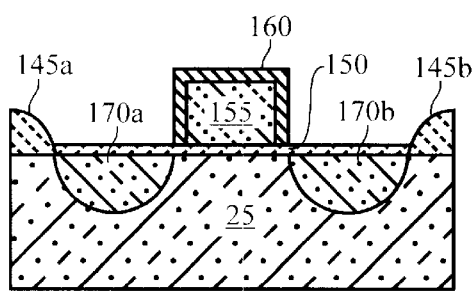
Figure 3F:
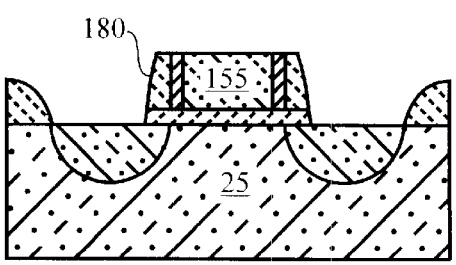
Figure 3C:
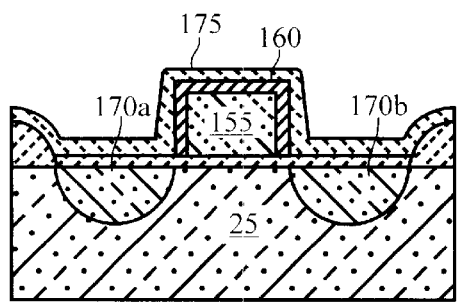
Figure 3G:
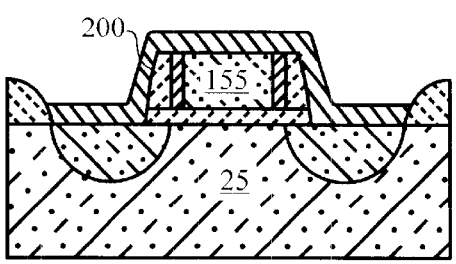
Figure 3D:
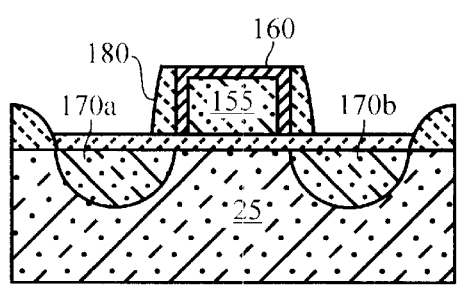

With reference to FIG. 3c, a silicon nitride layer 175 is deposited on the gate electrode 155 and the surrounding substrate 25 by low-pressure chemical vapor deposition (LPCVD) using a gas mixture of $SiH_2Cl_2$ and $NH_3$. The silicon nitride layer 175 is then etched using reactive ion etching (RIE) techniques to form nitride spacers 180 on the sidewall of the gate electrode 155, as shown in FIG. 3d. The spacers 180 electrically isolate the silicide layer formed on the top surface of the gate 155 from other silicide layers deposited over the source 170a and drain 170b. It should be noted that the electrical isolation sidewall spacers 180 and overlayers can be fabricated from other materials, such as silicon oxide. The silicon oxide layers used to form sidewall spacers 180 are typically deposited by CVD or PECVD from a feed gas of tetraethoxysilane (TEOS) at a temperature in the range of from about 600 to about 1000° C.

Referring to FIG. 3e, during the deposition and etching processes, a native silicon dioxide layer 185 forms on exposed silicon surfaces due to exposure atmosphere before and after the processes. Also, polymeric etchant deposits 190 are deposited on the substrate 25, particularly on the bottom and sidewalls of the etched features during the etching process. The polymeric etchant deposits 190 are byproducts of condensation reactions between vaporized and gaseous species in the chamber 30—for example, carbon, hydrogen, oxygen, and nitrogen species which react to form complex polymeric species. The native silicon dioxide layer 185 and polymeric etchant deposits 190 must be removed prior to forming conductive metal silicide contacts on the gate 155, source 170a, and drain 170b to improve the alloying reaction and electrical conductivity of the metal suicide formed. In addition, silicon lattice damage 195, which typically occurs during the RIE process as a result of ion bombardment of the exposed silicon containing source/drain regions, should also be removed. Silicon lattice damage 195 can increase the electrical resistance of the semiconducting material, and adversely affect the silicidation reaction of the silicon and metal layers that are subsequently deposited on the substrate 25. Therefore, it is necessary to remove this native silicon dioxide layer 185, polymeric etchant deposits 190, and silicon lattice damage 195 prior to forming metal silicide contacts or conductors for interconnecting active electronic devices on the substrate 25.

The process of the present invention is used after the spacer etch step (illustrated in FIG. 3c) and/or after the oxide stripping step (illustrated in FIG. 3d), and prior to the deposition of a refractory metal layer (illustrated in FIG. 3g) to improve the silicidation reaction and electrical conductivity of silicide contacts formed on the gate, source, and drain. The process comprises (i) a polymeric etchant deposits removal step which removes polymeric etchant deposits 190 formed on the sidewalls and features of the substrate 25 during spacer etch, (ii) a silicon lattice damage etching step which removes the silicon lattice damage 195 on the surface of the source/drain regions which was damaged by ion bombardment during implant, and (iii) a native silicon dioxide reduction step which removes the native silicon dioxide layer 185 by reducing the native silicon dioxide layer to elemental silicon. During the reduction process step, some of the silicon dioxide is also reduced by etching.

To perform the process of the present invention, the substrate 25 is placed on the support 45 in the process zone 40, and the process chamber 30 is evacuated. Activated cleaning, etching, and reducing gases, having the particular gas compositions described below, are then provided in the process zone 40 thereby exposing the substrate 25 to the activated gases. As shown in FIGS. 2a through 2c, the process gas can be introduced into the remote zone 75 of the remote chamber 80, activated by microwave or RF energy, and then transferred to the process zone 40. Alternatively, the process gas can be introduced directly into the process zone 40 where it is activated in-situ by applying RF power to the inductor antenna 85, process electrodes 90, or both. However, it is preferred to use a remotely activated gas to provide a "softer" and more chemically active etching of the substrate 25 that is easier to control than an in-situ plasma for the removal of thin layers, such as the polymeric etchant deposits 190, and native silicon dioxide layer 185, without damaging the surrounding silicon containing layers.

Polymeric etchant deposits 190 on the substrate 25 are removed using an activated cleaning gas. Preferably, the activated cleaning gas comprises an oxygen gas to which a suitable inorganic fluorinated gas has been added in a preselected ratio to enable the removal of polymeric etchant deposits 190 at lower substrate temperatures than would otherwise be possible. Suitable inorganic fluorinated gases include fluorine-containing gases that do not have hydrocarbon groups, such as $CF_4$, $NF_3$, or $SF_6$. Preferably, the inorganic fluorinated gas consists essentially of $CF_4$, which provides a lower number of dissociated fluorine-containing species and a more controlled deposit etching process. Alternatively, in process chambers 30 using remote gas activation, an inorganic fluorinated gas that provides a large number of dissociated fluorine-containing species, such as $NF_3$, can be used. This is because frequent collisions of the dissociated fluorine-containing species during transport of the activated gas from the remote zone 75 to the process zone 40 can result in recombination of dissociated atomic fluorine species into less reactive non-dissociated species, to provide a softer, and more controlled etch.

A suitable cleaning gas composition comprises oxygen gas and inorganic fluorinated gas in a volumetric flow ratio of from about 10:1 to about 200:1, as for example, recited in step 1 of Table I. More preferably, the process gas comprises from about 1 to about 10 volume % inorganic fluorinated gas, and most preferably about 3 volume % inorganic fluorinated gas, with the balance being oxygen. The pressure in the remote chamber 80 is maintained at from about 10 to about 5,000 mTorr, and more typically about 1000 mTorr. Helium gas is maintained at the backside of the substrate 25 at a pressure of from about 2 to about 20 Torr, and more typically about 8 Torr, to regulate the temperature of the substrate 25 to about 20 to about 120° C., and more preferably about 30° C.

The energy of the activated cleaning gas is tailored to provide high chemical reactivity with the type of polymeric etchant deposits 190 being removed from the substrate 25. The cleaning gas comprises inorganic fluorinated gas and oxygen gas that are activated by microwaves coupled into the remote zone 75, preferably, at a power of from about 300 to about 3,000 Watts, and more preferably of 500 to 2,000 Watts.

TABLE I

| | | STEP 1<br>Polymeric Etchant<br>Deposit Removal<br>Step | STEP 2<br>Silicon<br>Etch Step | STEP 3<br>Native Silicon<br>Dioxide<br>Reduction Step |
|---|---|---|---|---|
| Inorganic Fluorinated Gas ($NF_3$) | sccm | 30 | 10 | 0 |
| Oxygen | sccm | 1000 | 190 | 0 |
| Reducing Gas | sccm | 0 | 0 | 200 |
| Inert Gas | sccm | 0 | 0 | 200 |
| Microwave Power | Watt | 1000 | 800 | 800 |
| Temperature | ° C. | 30 | 30 | 30 |
| Pressure | mTorr | 1000 | 400 | 1000 |
| Backside Helium | Torr | 8 | 8 | 8 |

After removal of the polymeric etchant deposits 190, the exposed layer of silicon on the surface of the substrate 25 that has silicon lattice damage 195 is etched to remove the damaged silicon lattice sites and to provide a higher density of nucleation sites, which enhances bonding of subsequently deposited layers and also enhances formation of silicide layers by diffusional processes. The silicon lattice damage etching step uses an activated silicon etching gas that also comprises a mixture of oxygen gas and inorganic fluorinated gas. However, in this gas composition the volumetric flow ratio of the oxygen gas to the inorganic fluorinated gas is substantially reduced (as compared to the polymeric etchant deposit cleaning gas) so that the gas has a higher percentage of inorganic fluorinated etchant species available for etching the silicon lattice damage on the substrate 25. In this step, a preferred ratio of oxygen gas to inorganic fluorinated gas is from about 10:1 to about 50:1, and more typically about 20:1. Suitable inorganic fluorinated gas include $CF_4$, $NF_3$, and $SF_6$ as previously described. The pressure in the remote chamber 80 is maintained at from about 10 to about 1,000 mTorr, and more preferably about 400 mTorr. The microwave generator 115 is operated at a power of from about 100 to about 2,000 Watts, and more preferably of 400 to 1,000 Watts. Helium gas is maintained at the backside of the substrate 25 at a pressure of about 8 Torr, to provide a substrate temperature of about 30° C.

During the above-described processing steps, particularly those steps in which $O_2$ is used, a native silicon dioxide layer 185 forms on the exposed silicon surfaces of the substrate 25 due to exposure to the gaseous oxidizing environment. Thus the next step is directed to removing the native silicon dioxide layer 185 using an activated reducing gas, preferably, a hydrogen-containing reducing gas. Suitable hydrogen-containing reducing gases include $H_2$, $CH_3F$, $H_2S$, $NH_3$, $CH_4$, $C_2H_6$, $C_3H_8$, or $B_2H_6$ or mixtures thereof. Suitable flow rates for the reducing gas in a chamber 30 having a five-liter volume are from about 1 to 1000 sccm, and more typically from 100 to 500 sccm. In one preferred embodiment, the reducing gas is introduced into the remote zone 75, where it is activated with microwave energy by the gas activator 82. While the reducing gas is in the remote zone 75 the microwave generator 115 is typically operated at a power of about 300 Watts to 3000 Watts, and more typically 500 Watts to 2000 Watts. The resultant microwave-activated reducing gas is then introduced into the process zone 40 to reduce the native silicon dioxide layer 185 on the substrate 25 to a non-oxide silicon layer. During the chemical reduction process, the substrate 25 is maintained at a temperature of 30° C. to 120° C. Heat transfer from the substrate 25 is accomplished by flowing helium at a pressure of about 8 Torr behind the substrate; and the chamber 30 is maintained at a pressure typically of about 1 to about 5000 mTorr, and more typically about 1000 mTorr.

It is believed that the microwave-activated hydrogen species of the reducing gas reduces the native silicon dioxide film 185 on the substrate surface by combining with oxygen species in the film to produce elemental silicon, and volatile water vapor which is then exhausted from the chamber 30. The process conditions can be optimized to chemically reduce the native silicon dioxide film 185 without etching or otherwise damaging the surrounding silicon-containing layers by chemical attack or energetic impingement of plasma ions. Conventional oxide etching processes which use RIE plasmas do not allow precise control of the amounts of ionic and dissociated neutral species in the process. Furthermore, RIE processes often maintain the substrate 25 at an electric potential that can causes energized ionic species to bombard the substrate 25 resulting in sputtering or etching damage. In contrast, the remote microwave-activated reducing gas process provides purely isotropic reduction of the native silicon dioxide layer 185. For these reasons, the microwave-activated reducing gas provides significant advantages over the prior art.

When conventional methods are used to remove the native silicon dioxide layers 185 formed on the substrate 25 after a sidewall spacer etching step, they often result in silicon lattice damage. The process of the present invention prevents such defects by removing the native silicon dioxide layer 185 on the substrate 25 by chemical reduction without damaging the surrounding silicon-containing layers. The hydrogen species of the reducing gas combine with oxygen species in the native silicon dioxide layers 185, to produce elemental silicon and water vapor. Because the silicide layer or metal layer used to form a silicide is deposited on a silicon surface which contains substantially no native silicon dioxide 185, or polymeric etchant deposits 190, and has a more ideal atomic-scale surface morphology that is substantially absent silicon lattice damage 195, the resulting contact structure is highly conductive and has few failures. This in turn provides much higher yields of integrated circuit chips from the silicon substrate 25.

In a preferred embodiment of the invention, the composition of the reducing gas is modified by adding an inert gas to increase the utilization of reducing species by lowering the rate of gas phase recombination reactions in which dissociated ionic species recombine to form non-dissociated molecular species. Generally, it is desirable to maintain a high concentration of dissociated hydrogen species that are more chemically active than the non-dissociated species. The addition of an inert gas has a diluting or buffering effect that serves to inhibit recombination reactions in which the dissociated ionic species recombine to form non-dissociated molecular species. This is particularly useful when the remote zone 75 is distant from the process zone 40 because it serves to slow recombination reactions during transfer of the microwave-activated ionic species from the remote zone 75 to the process zone 40. The dilutant or buffering inert gas reduces the rate of such recombination reactions, thereby providing a higher concentration of dissociated species in the process zone 40 and faster and more effective reduction of the native silicon dioxide layer 185. Suitable inert gases include $N_2$, Ar, He, or mixtures thereof. The volumetric flow ratio of hydrogen-containing gas to inert gas is selected to optimize the ratio of dissociated to non-dissociated ionic species. A preferred reducing gas composition comprises a volumetric flow ratio of hydrogen-containing gas to inert gas of from about 1:1 to about 1:10.

In another embodiment of the invention, the reducing gas further comprises an inorganic fluorinated gas to produce fluorine species that react with hydrogen species to form molecular hydrogen fluoride which further aids in the removal of the native silicon dioxide layer 185 on the substrate 25. The reducing gas is activated by microwaves in the remote zone 75, where the hydrogen species and fluorine species react to form HF species. Thereafter, the activated reducing gas, comprising microwave-activated HF species, is introduced into the process zone 40 to reduce the native silicon dioxide layer 185 on the substrate 25. The HF species remove the native silicon dioxide layer 185 by a chemical etching process rather than by direct hydrogen reduction. It is believed the combination of chemical reduction by the hydrogen species and chemical etching by the HF species is particularly effective at removing thin layers of native silicon dioxide without damaging or etching surrounding layers of the substrate 25. A preferred reducing gas composition comprises a volumetric flow ratio of a suitable inorganic fluorinated gas to hydrogen-containing gas of from about 0.2:1 to about 5:1. Suitable inorganic fluorinated gas include $CF_4$, $NF_3$, or $SF_6$, or mixtures thereof. In addition, because the inorganic fluorinated gases are capable of depositing undesirable fluorine-containing materials on the substrate 25, the reducing gas can also comprise an oxygen gas to suppress such deposition. The addition of an oxygen gas is particularly desirable when carbon or sulfur-containing inorganic fluorinated gas, such as $CF_4$ or $SF_6$, are used.

The process of the present invention, as described above, removes the polymeric etchant deposits 190, damaged silicon lattice damage 195 and the native silicon dioxide layers 185, to expose the source 170*a*, drain 170*b*, and the top surface of the gate electrode 155 as shown in FIG. 3F. Thereafter, as illustrated in FIG. 3*g*, a PVD sputtering process is used to deposit a layer of metal 200 over the entire substrate 25. Conventional furnace annealing is then used to anneal the metal and silicon layers to form metal silicide in regions in which the metal layer 200 is in contact with silicon. Annealing typically involves heating the substrate 25 to a temperature of between 600 and 800° C. in an atmosphere of nitrogen for about 30 minutes. Alternatively, metal silicide 205 can be formed utilizing a rapid thermal annealing process in which the substrate 25 is rapidly heated to about 1000° C. for about 30 seconds. Suitable conductive metals include cobalt, titanium, nickel, and platinum. Of these, titanium is preferred since titanium silicide has the lowest contact resistance of all the refractory metals and forms reliable metal silicide contacts on both polysilicon and monocrystalline silicon.

Figure 3H:
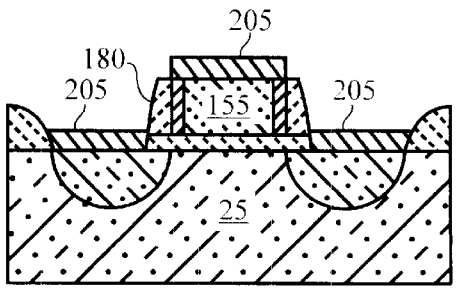
Figure 4:
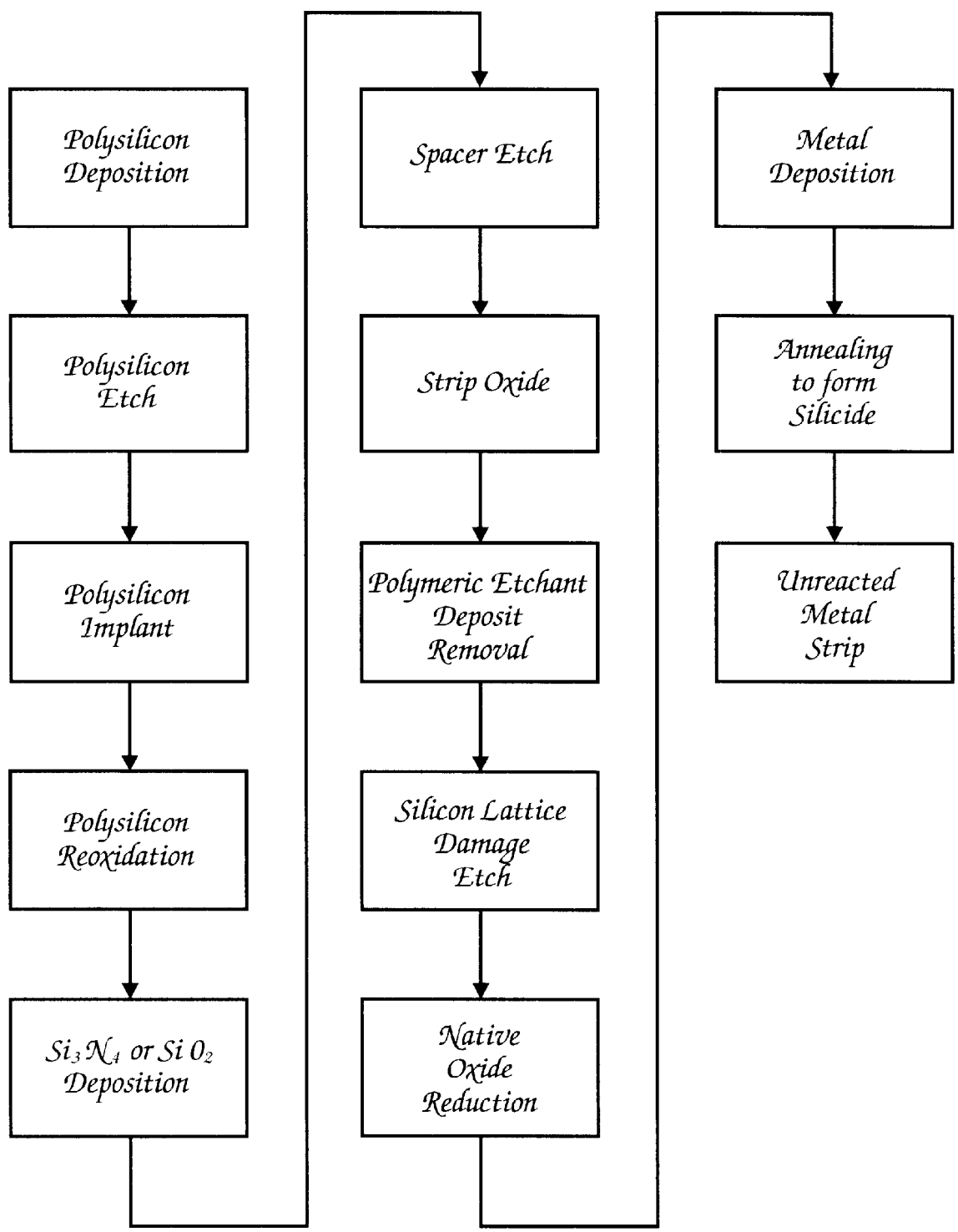
FIG. 4 is a flow chart of an etching process of the present invention.

Unreacted portions of the metal layer 200 are removed by a wet etch using aqua regia, HCl, and $HNO_3$, which removes the metal without attacking the metal silicide 205; the spacer 180, or the field oxide 145a,b, thus leaving a self-aligned metal silicide contact on the gate 155, source 170a, and drain 170b, as shown in FIG. 3h. Thereafter, an insulating cover layer comprising, for example, silicon oxide, BPSG, or PSG, can be deposited on the electrode structures. The insulating cover layer is deposited by means of chemical-vapor deposition in a CVD chamber, in which the material condenses from a feed gas at low or atmospheric pressure, as for example, described in commonly assigned U.S. Pat. No. 5,500,249, issued Mar. 19, 1996, which is incorporated herein by reference. Thereafter, the substrate 25 is annealed at glass transition temperatures to form a smooth planarized surface on the substrate 25.

Although the present invention has been described in considerable detail with regard to the preferred versions thereof, other versions are possible. For example, the present process can also be used to remove the native silicon dioxide layers 185 prior to the deposition of other metal, insulating, or semiconducting layers. Also, although the process has been described in relation to the formation of a MOSFET device, the process of the present invention can also be used to form other semiconductor structures and devices that have other metal silicide layers, for example, suicides of tungsten, tantalum, molybdenum. The present process can also be used prior to the deposition of layers of different metals including, for example, aluminum, copper, silicon, titanium, palladium, hafnium, boron, tungsten, tantalum, or mixtures thereof. Furthermore, gases equivalent in function to the hydrogen-containing gas, inert gas, oxygen gas, and inorganic fluorinated gas described here can also be used. Therefore, the appended claims should not be limited to the description of the preferred versions contained herein.

What is claimed is:

1. A method of treating a substrate, the method comprising the steps of:
   (a) placing the substrate in a process zone and etching features on the substrate, thereby forming etchant deposits on the substrate;
   (b) exposing the substrate to an activated cleaning gas comprising oxygen-containing gas and fluorine-containing gas, to remove the etchant deposits on the substrate;
   (c) exposing the substrate to an activated etching gas to remove silicon lattice damage on the substrate; and
   (d) after step (b) or step (c), exposing the substrate to microwave-activated reducing gas to reduce a native silicon dioxide layer on the substrate.

2. A method according to claim 1 wherein the activated reducing gas comprises a hydrogen-containing gas comprising one or more of $H_2$, $CH_3F$, $H_2S$, $NH_3$, $CH_4$, $C_2H_6$, $C_3H_8$, or $B_2H_6$.

3. A method according to claim 2 wherein the activated reducing gas further comprises an inert gas comprising one or more of $N_2$, Ar, or He.

4. A method according to claim 3 wherein the activated reducing gas further comprises an inorganic fluorinated gas.

5. A method according to claim 4 wherein the volumetric flow ratio of the inorganic fluorinated gas to the hydrogen-containing gas is from about 1:5 to about 5:1.

6. A method according to claim 1 wherein the activated reducing gas comprises hydrogen-containing gas in a flow rate of about 10 volume % to about 100 volume % of the total volumetric flow rate of the activated reducing gas.

7. A method according to claim 1 wherein the activated cleaning gas comprises inorganic fluorinated gas comprising one or more of $CF_4$, $NF_3$, or $SF_6$.

8. A method according to claim 1 wherein the volumetric flow ratio of the oxygen gas to the inorganic fluorinated gas is from about 10:1 to about 200:1.

9. A method according to claim 1 wherein the activated etching gas comprises oxygen gas and inorganic fluorinated gas in a volumetric flow ratio of from about 10:1 to about 50:1.

10. A method according to claim 1 wherein the activated cleaning gas, the activated etching gas, and the activated reducing gas, are activated by microwave or RF energy in a remote chamber that is remote from the process zone.

11. A method of processing a substrate, the method comprising the steps of:
    (a) etching a dielectric layer on the substrate by exposing the substrate to an etching gas, the dielectric layer comprising one or more of silicon oxide or silicon nitride;
    (b) removing etchant deposits on the substrate by exposing the substrate to activated cleaning gas comprising oxygen-containing gas and fluorine-containing gas in a first volumetric flow ratio of oxygen-containing gas to fluorine-containing gas;
    (c) etching silicon lattice damage on the substrate by exposing the substrate to activated etching gas comprising oxygen-containing gas and fluorine-containing gas in a second volumetric flow ratio of oxygen-containing gas to fluorine-containing gas;
    (d) after step (b) or step (c), reducing a native silicon dioxide layer on the substrate by exposing the substrate to microwave activated reducing gas comprising a hydrogen-containing gas to form a silicon layer on the substrate; and
    (e) after step (d), depositing a metal layer on the silicon layer on the substrate, and annealing the substrate to form a metal silicide layer.

12. A method according to claim 11 wherein the hydrogen-containing gas comprises one or more of $H_2$, $CH_3F$, $H_2S$, $NH_3$, $CH_4$, $C_2H_6$, $C_3H_8$, or $B_2H_6$.

13. A method according to claim 12 wherein the activated reducing gas further comprises an inert gas comprising one or more of $N_2$, Ar, or He.

14. A method according to claim 13 wherein the activated reducing gas further comprises an inorganic fluorinated gas.

15. A method according to claim 14 wherein the inorganic fluorinated gas comprises one or more of $CF_4$, $NF_3$, and $SF_6$.

16. A method according to claim 15 wherein the volumetric flow ratio of the inorganic fluorinated gas to the hydrogen-containing gas is from about 1:5 to about 5:1.

17. A method according to claim 11 wherein the first volumetric flow ratio of the oxygen gas to the inorganic flourinated gas is from about 10:1 to about 200:1 and the second volumetric flow ratio of the oxygen gas to the inorganic flourinated gas is from about 10:1 to about 50:1.

18. A method according to claim 11 wherein the activated cleaning gas, the activated etching gas, and the activated reducing gas, are activated by microwave or RF energy in a remote chamber that is remote from the process zone.

19. A method of reducing a native silicon dioxide layer on a substrate, the method comprising the steps of:
(a) placing the substrate in a process zone;
(b) introducing in a remote zone that is remote from the process zone, a reducing gas comprising a hydrogen-containing gas comprising one or more of $H_2$, $CH_3F$, $H_2S$, $NH_3$, $CH_4$, $C_2H_6$, $C_3H_8$, and $B_2H_6$; and
(c) forming a microwave-activated reducing gas by coupling microwaves in the remote zone and introducing the microwave-activated reducing gas in the process zone to reduce the native silicon dioxide layer to a silicon layer.

20. A method according to claim 19 wherein the reducing gas further comprises one or more of $N_2$, Ar, or He.

21. A method according to claim 19 wherein the reducing gas comprises hydrogen-containing gas in a flow rate of about 10 volume % to about 100 volume % of the total volumetric flow rate of the reducing gas.

22. A method according to claim 21 wherein the hydrogen-containing gas consists essentially of $H_2$.

23. A method according to claim 21 wherein the reducing gas further comprises an inorganic fluorinated gas.

24. A method according to claim 23 wherein the volumetric flow ratio of the inorganic fluorinated gas to the hydrogen-containing gas is from about 1:5 to about 5:1.

25. A method according to claim 23 wherein the reducing gas further comprises an oxygen gas.

26. A method of treating a substrate, the method comprising the steps of:
(a) placing the substrate in a process zone;
(b) exposing the substrate to an activated cleaning gas comprising a first volumetric flow ratio of oxygen-containing gas to fluorine-containing gas of from about 10:1 to about 200:1 to remove etchant deposits on the substrate;
(c) exposing the substrate to an activated etching gas comprising a second volumetric flow ratio of oxygen-containing gas to fluorine-containing gas of from about 10:1 to about 50:1 to remove silicon lattice damage on the substrate; and
(d) after step (b) or step (c), exposing the substrate to a microwave-activated reducing gas to reduce a native silicon dioxide layer on the substrate.

27. A method according to claim 26 wherein the activated reducing gas comprises one or more of $H_2$, $CH_3F$, $H_2S$, $NH_3$, $CH_4$, $C_2H_6$, $C_3H_8$, or $B_2H_6$.

28. A method according to claim 27 wherein the activated reducing gas comprises one or more of $N_2$, Ar, or He.

29. A method according to claim 26 wherein the activated reducing gas comprises an inorganic fluorinated gas.

30. A method according to claim 26 wherein the activated cleaning gas comprises inorganic fluorinated gas comprising one or more of $CF_4$, $NF_3$, or $SF_6$.

31. A method according to claim 26 wherein the activated cleaning gas, the activated etching gas, and the activated reducing gas, are activated by microwave or RF energy in a remote chamber that is remote from the process zone.

32. A method of reducing a native silicon dioxide layer on a substrate, the method comprising the steps of:
(a) placing the substrate in a process zone; and
(b) providing a microwave activated gas consisting essentially of $H_2$ into the process zone to reduce the native silicon dioxide layer to a silicon layer.

33. A method of reducing a native silicon dioxide layer on a substrate, the method comprising the steps of:
(a) placing the substrate in a process zone; and
(b) providing a microwave activated reducing gas into the process zone, the microwave activated reducing gas comprising a hydrogen-containing gas comprising one or more of $H_2$, $CH_3F$, $H_2S$, $NH_3$, $CH_4$, $C_2H_6$, $C_3H_8$, and $B_2H_6$, and wherein the microwave activated reducing gas comprises hydrogen-containing gas in a flow rate of about 10 volume % to about 100 volume % of the total volumetric flow rate of the reducing gas to reduce the native silicon dioxide layer.

34. A method according to claim 33 wherein the reducing gas further comprises one or more of $N_2$, Ar, or He.

35. A method according to claim 33 wherein the hydrogen-containing gas consists essentially of $H_2$.

36. A method according to claim 33 wherein the reducing gas further comprises an inorganic fluorinated gas.

37. A method according to claim 33 wherein the reducing gas further comprises an oxygen gas.

* * * * *